United States Patent
Lee

(10) Patent No.: US 9,691,494 B2
(45) Date of Patent: Jun. 27, 2017

(54) SEMICONDUCTOR DEVICE AND METHOD OF OPERATING THE SAME USING LASTLY ERASED MEMORY BLOCK

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 70 days.

(21) Appl. No.: 14/592,631

(22) Filed: Jan. 8, 2015

(65) Prior Publication Data

US 2016/0062686 A1   Mar. 3, 2016

(30) Foreign Application Priority Data

Aug. 26, 2014 (KR) .......................... 10-2014-0111415

(51) Int. Cl.
| | | |
|---|---|---|
| G06F 13/00 | (2006.01) |
| G11C 16/34 | (2006.01) |
| G06F 12/02 | (2006.01) |
| G11C 16/10 | (2006.01) |
| G11C 16/14 | (2006.01) |
| G06F 3/06 | (2006.01) |
| G11C 16/16 | (2006.01) |

(52) U.S. Cl.
CPC ...... *G11C 16/3495* (2013.01); *G06F 12/0246* (2013.01); *G11C 16/10* (2013.01); *G11C 16/14* (2013.01); *G06F 3/0652* (2013.01); *G06F 3/0679* (2013.01); *G11C 16/16* (2013.01)

(58) Field of Classification Search
CPC ...... G06F 3/0688; G06F 3/0619; G06F 3/065; G06F 3/0652; G06F 12/0246; G06F 2212/7211; G06F 3/0679; G11C 16/349; G11C 16/3495; G11C 16/10; G11C 16/14; G11C 16/16
USPC .......................... 711/103, 155; 707/206, 813; 365/185.09, 185.11
See application file for complete search history.

(56) References Cited

U.S. PATENT DOCUMENTS

| | | | | |
|---|---|---|---|---|
| 8,335,888 B2* | 12/2012 | Zhan | ...................... | G06F 11/073 711/103 |
| 2003/0189860 A1* | 10/2003 | Takeuchi | ............. | G11C 16/102 365/200 |
| 2003/0196029 A1* | 10/2003 | Komatsu | ................ | G11C 29/76 711/103 |
| 2005/0257017 A1* | 11/2005 | Yagi | ........................ | G06F 21/79 711/163 |
| 2008/0104310 A1* | 5/2008 | Stern | .................... | G11C 16/102 711/103 |
| 2009/0327591 A1* | 12/2009 | Moshayedi | ......... | G06F 11/1441 711/103 |
| 2011/0219177 A1* | 9/2011 | Kanno | ................ | G06F 11/1068 711/103 |

(Continued)

FOREIGN PATENT DOCUMENTS

KR     1020130042780     4/2013

*Primary Examiner* — Hong Kim
(74) *Attorney, Agent, or Firm* — IP & T Group LLP

(57) ABSTRACT

A semiconductor device and a method of operating the same are provided. A plurality of memory blocks are erased. It is determined whether a selected memory block among the memory blocks is a lastly erased memory block. The selected memory block or another memory block is programmed according to a result of determination.

17 Claims, 10 Drawing Sheets

(56) References Cited

U.S. PATENT DOCUMENTS

2015/0113206 A1* 4/2015 Fitzpatrick ......... G11C 16/3495
  711/103
2017/0069391 A1* 3/2017 Lee ...................... G11C 16/16

* cited by examiner

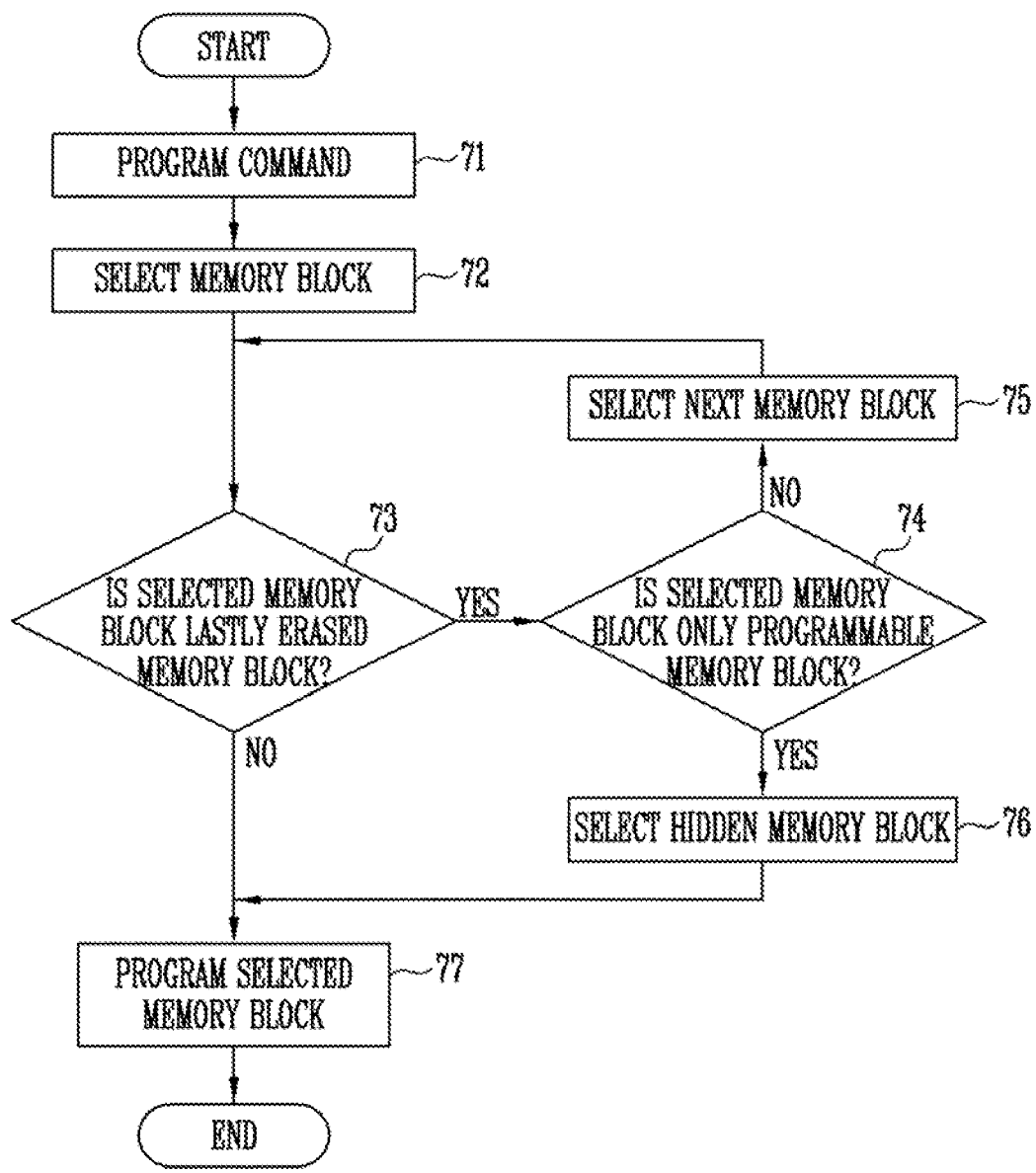

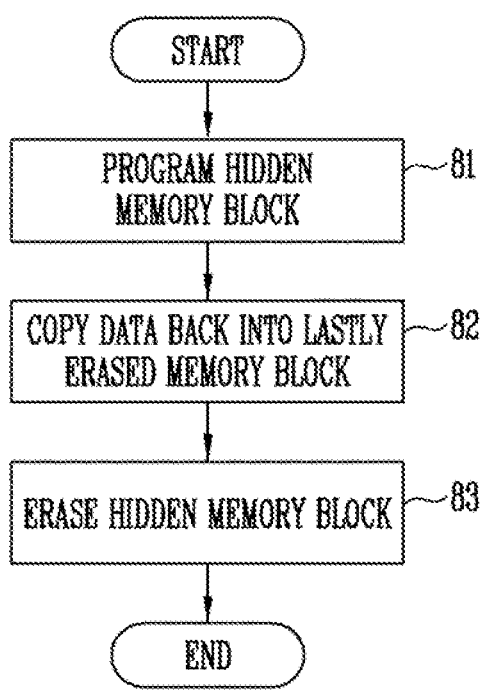

BEFORE MARKING

AFTER MARKING

REMOVE MARKING

SEMICONDUCTOR DEVICE AND METHOD OF OPERATING THE SAME USING LASTLY ERASED MEMORY BLOCK

CROSS-REFERENCE TO RELATED APPLICATION

The present application claims priority to Korean Patent Application Number 10-2014-0111415, filed on Aug. 26, 2014, the entire disclosure of which is incorporated herein in its entirety by reference.

BACKGROUND

Field of the Invention

The present invention relates to a semiconductor device and a method of operating the same. More specifically, the present invention relates to a program operation of a semiconductor device.

Description of Related Art

A semiconductor device includes a memory cell array for storing data.

The memory cell array includes a plurality of memory blocks. Each of the memory blocks includes a plurality of cell strings having a plurality of memory cells.

To increase integration of semiconductor devices, 3-dimensional cell strings, which are aligned perpendicularly with the semiconductor substrate, have recently been developed. When a program voltage is applied to a gate, memory cells of a 3-dimensional semiconductor device are programmed by trapping negative charges in a charge trap layer.

However, because the charge trap layer extends along adjacent memory cells, negative charges that are trapped in the charge trap layer may be easily dissipated toward adjacent memory cells. Thus, retention characteristics of the semiconductor device may be degraded.

SUMMARY

The present invention is directed to a semiconductor device and a method of operating the semiconductor device for improving retention characteristics of the semiconductor device.

One aspect of the present invention provides a method of operating a semiconductor device including: erasing memory blocks; determining whether a selected memory block among the memory blocks is a lastly erased memory block; and programming the selected memory block or another memory block according to a result of determination.

Another aspect of the present invention provides a semiconductor device including: a cell array including memory blocks, one or more of which are hidden memory blocks; a peripheral circuit suitable for performing an erase operation and a program operation on the memory blocks; and a control circuit suitable for controlling the peripheral circuit to erase memory blocks, and determine whether a selected memory block among the memory blocks is a lastly erased memory block, and program the selected memory block or another memory block according to a result of determination.

According to the present invention, a time delay is formed between the erase operation and the program operation, so that retention characteristics of the programmed memory cells may be improved. Thus, reliability of the semiconductor device may be improved.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 7 is a flow chart illustrating a program operation according to an exemplary embodiment of the present invention;

FIG. 8 is a flow chart illustrating a hidden memory block operation after completion of a program operation according to an exemplary embodiment of the present invention;

DETAILED DESCRIPTION

The present invention will be described more fully hereinafter with reference to the accompanying drawings, in which exemplary embodiments of the invention are shown. This invention may, however, be embodied in different forms and should not be construed as limited to the embodiments set forth herein.

Figure 1:
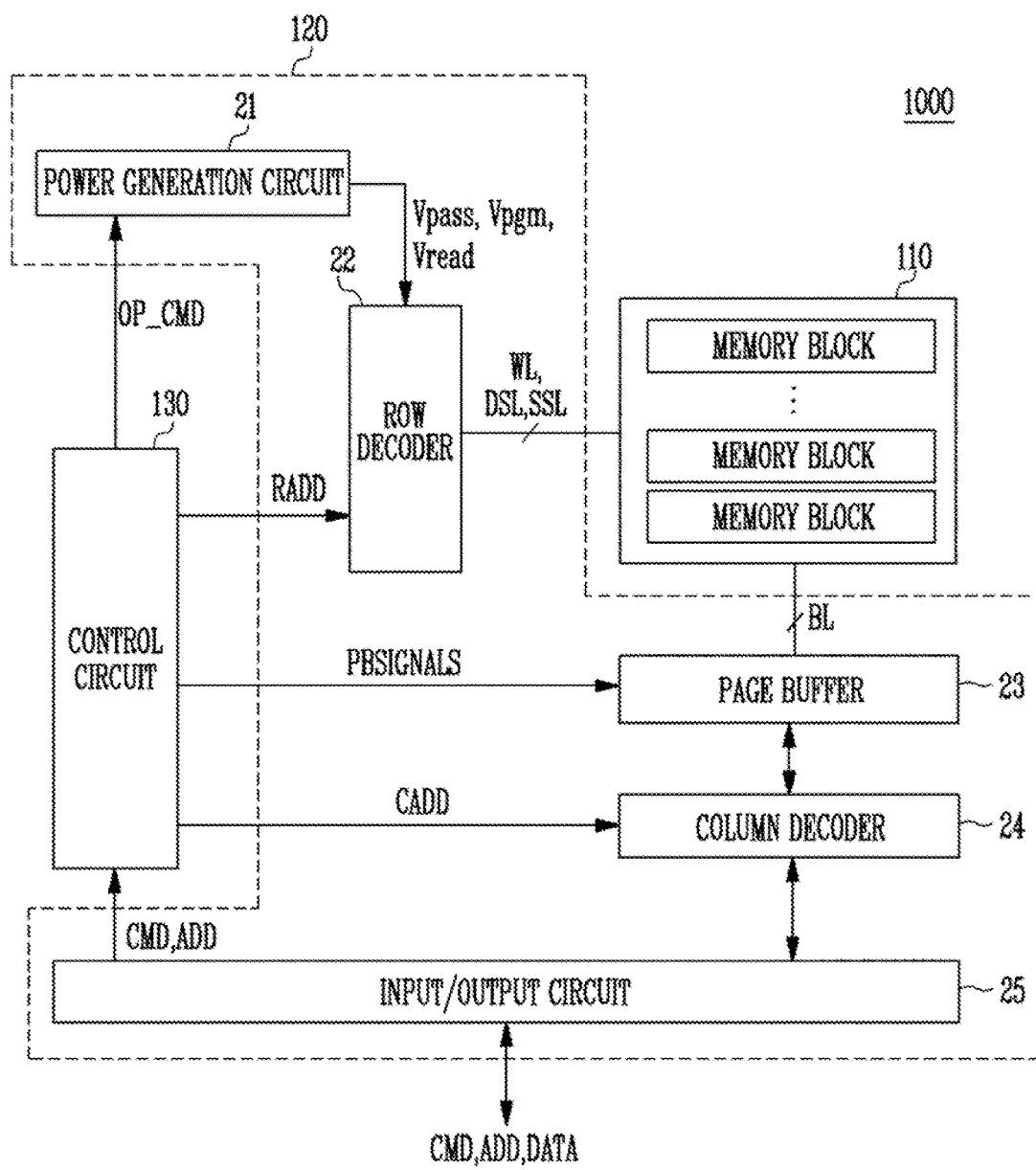
FIG. 1 is a block diagram illustrating a semiconductor device according to an exemplary embodiment of the present invention.

FIG. 1 is a block diagram illustrating a semiconductor device 1000 according to an exemplary embodiment of the present invention.

Referring to FIG. 1, the semiconductor device 1000 may include a memory cell array 110, a peripheral circuit 120, and a control circuit 130. Data may be stored in the memory cell array 110. The peripheral circuit 120 may perform a program operation, a read operation, and an erase operation of the memory cell array 110. The control circuit 130 may control the peripheral circuit 120.

The memory cell array 110 may include a plurality of memory blocks. Each of the memory blocks may be substantially the same. Each of the memory blocks may include a plurality of cell strings (not shown). The cell strings may have a 2-dimensional structure or a 3-dimensional structure.

For example, the cell strings having the 2-dimensional structure may be horizontally aligned on a semiconductor substrate. The cell strings having the 3-dimensional structure may be aligned perpendicularly with a semiconductor substrate.

The peripheral circuit 120 may include a power generation circuit 21, a row decoder 22, a page buffer 23, a column decoder 24, and an input/output circuit 25.

The power generation circuit 21 may generate various operation voltages in response to an operation command signal OP_CMD. The operation command signal OP_CMD may include a program command signal, a read command signal, and an erase command signal. For example, the power generation circuit 21 may generate a program voltage Vpgm, a read voltage Vread, and a pass voltage Vpass. Also, the power generation circuit 21 may generate various voltages having various levels.

The row decoder 22 may select one memory block from the memory blocks of the memory cell array 110 in response to a row address RADD. The row decoder 22 may apply the operation voltages to a word line WL, a plurality of drain select lines DSL, and a plurality of source select lines SSL connected to the selected memory block.

The page buffer 23 may be connected to the memory blocks through a plurality of bit lines BL. The page buffer 23 may exchange data with the selected memory block during the program operation, the read operation, and the erase operation. The page buffer 23 temporarily stores the data received from the selected memory block.

The column decoder 24 may exchange data with the page buffer 23 in response to a column address CADD.

The input/output circuit 25 may transmit a command signal CMD and an address ADD that are provided from an outside (e.g. an external source) to the control circuit 130. The input/output circuit 25 may transmit the data DATA that is provided from the outside to the column decoder 24. The input/output circuit 25 may output the data DATA that is transmitted from the column decoder 24 to the outside, or may transmit the data DATA to the control circuit 130.

The control circuit 130 may control the peripheral circuit 120 to perform the program operation, the read operation or the erase operation in response to the command signal CMD and the address ADD. In particular, during the program operation of the control circuit 130, the control circuit 130 may control the peripheral circuit 120 such that the program operation may not be immediately performed on a memory block, on which the erase operation has been performed, but may be performed on the memory block on which the erase operation has been performed after a time delay. The program operation will be explained in detail.

Figure 2:
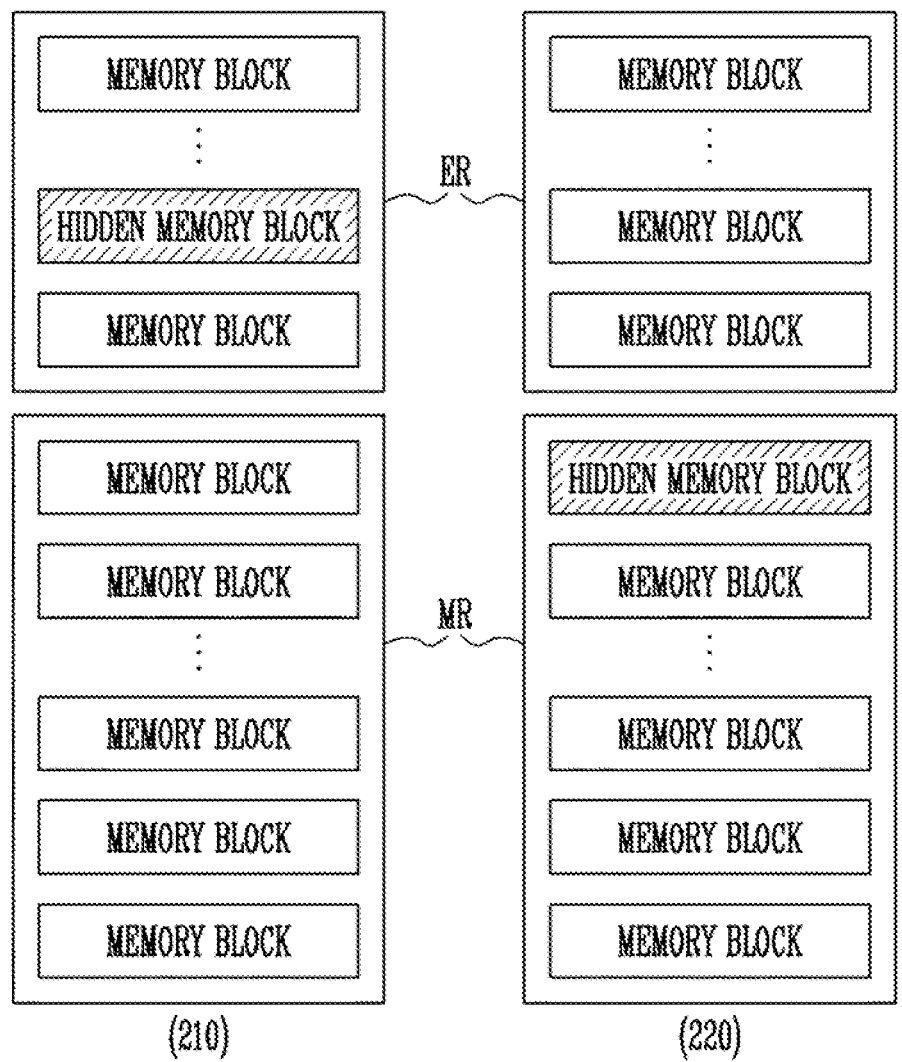
FIG. 2 is a block diagram illustrating a memory cell array according to an exemplary embodiment of the present invention.

FIG. 2 is a block diagram illustrating a memory cell array according to an exemplary embodiment of the present invention.

Referring to FIG. 2, the memory cell array 110 (shown in FIG. 1) may include a main region MR and an extra region ER. A plurality of memory blocks may be disposed in each of the main region MR and the extra region ER. One or more memory blocks among the memory blocks in the main region MR or the extra region ER may be set to be a hidden memory block.

In the program operation, when the selected memory block is a lastly erased memory block, the hidden memory block temporarily may perform the program operation. One memory block 210 of the memory blocks in the extra region ER, or one memory block 220 of the memory blocks in the main region MR, may be set to be the hidden memory block.

Thus, when the memory blocks are erased, two or more memory blocks including the hidden memory block may be erased.

The memory blocks in the main region MR and the extra region ER may be substantially the same. The memory blocks in the main region MR and the extra region ER may have a 3-dimensional structure or a 2-dimensional structure. The memory blocks of the 3-dimensional structure and the memory blocks of the 2-dimensional structure will each be explained below.

Figure 3:
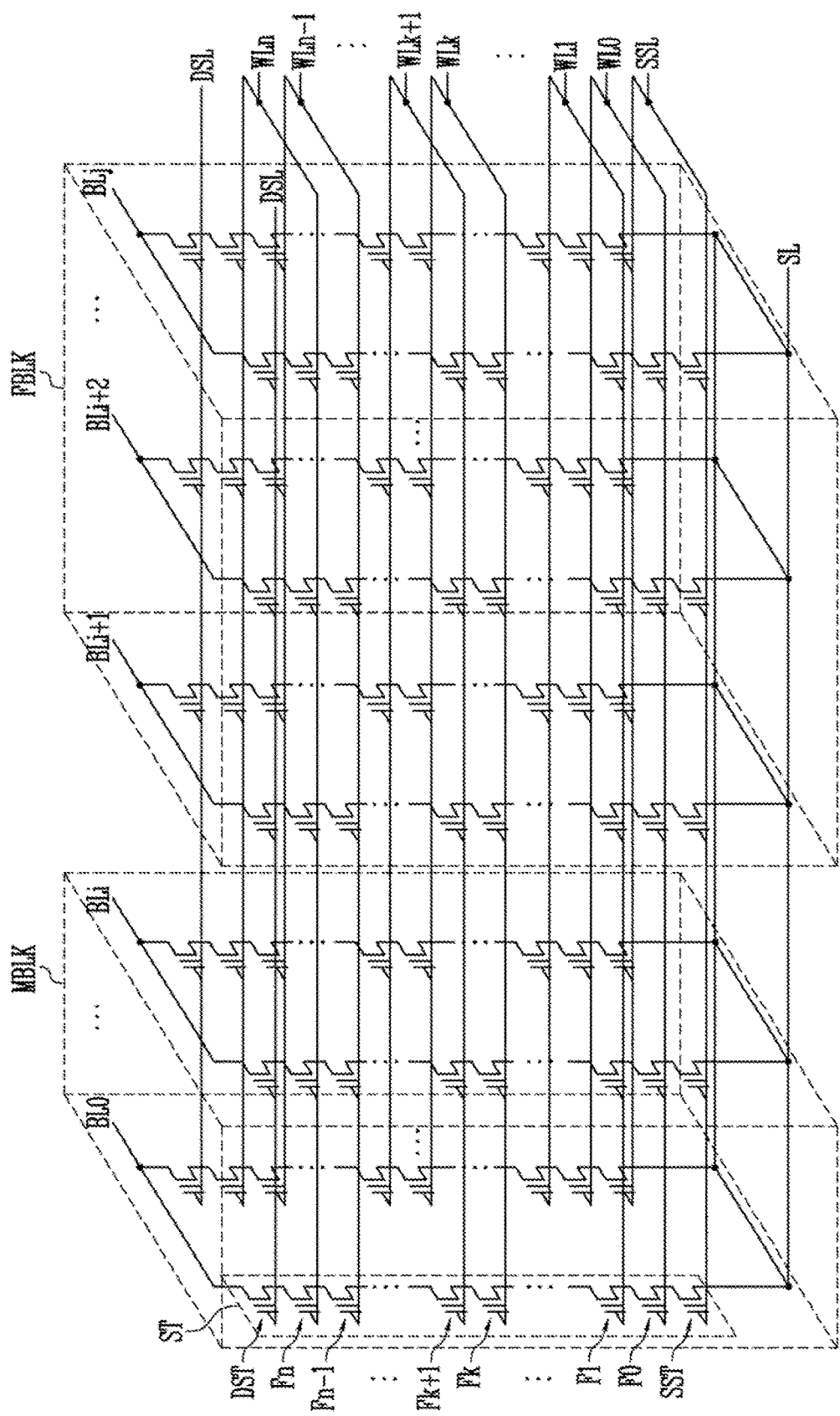
FIG. 3 is a circuit diagram illustrating a memory block of a 3-dimensional semiconductor device according to an exemplary embodiment of the present invention.

FIG. 3 is a circuit diagram illustrating a memory block of a 3-dimensional semiconductor device according to an exemplary embodiment of the present invention.

Referring to FIG. 3, one of the memory blocks of the 3-dimensional structure is illustrated as an exemplary memory block. The memory block of the 3-dimensional structure may include a main block MBLK and a flag block FBLK. Different kinds of data may be stored in the main block MBLK and the flag block FBLK. The data stored in the main block MBLK may have substantially the same structure as the data stored in the flag block FBLK. For example, normal data used by a user may be stored in a plurality of normal memory cells of the main block MBLK. Flag data used by the semiconductor device 1000 may be stored in a plurality of flag cells of the flag block FBLK. The flag data may include data including LSB or MSB program operation information and marking data. The marking data may include information on whether the selected memory block is the lastly erased memory block, information on whether the selected memory block is programmable, and information on whether the programming of the selected memory block is completed.

In the memory block of the 3-dimensional structure, the cell strings ST may be connected between the bit lines BL0 to BLj and the source line SL, and the cell strings ST may be aligned perpendicularly with the semiconductor substrate. In FIG. 3, the cell strings ST may be arranged in an 'I' shape. Alternatively, the cell strings ST may be arranged in a 'U' shape.

Each of the cell strings ST may include a plurality of source select transistors SST, a plurality of memory cells F0 to Fn, and a plurality of drain select transistors DST. The source select transistors SST may be connected between the source line SL and the memory cells F0. The drain select transistors DST may be connected between a plurality of bit lines BL0 to BLi and the memory cells Fn. Gates of the source select transistors SST may be connected to the source select line SSL. Gates of the memory cells F0 to Fn may be connected to the word lines WL0 to WLn. Gates of the drain select transistors DST may be connected to the drain select lines DSL.

Figure 4:
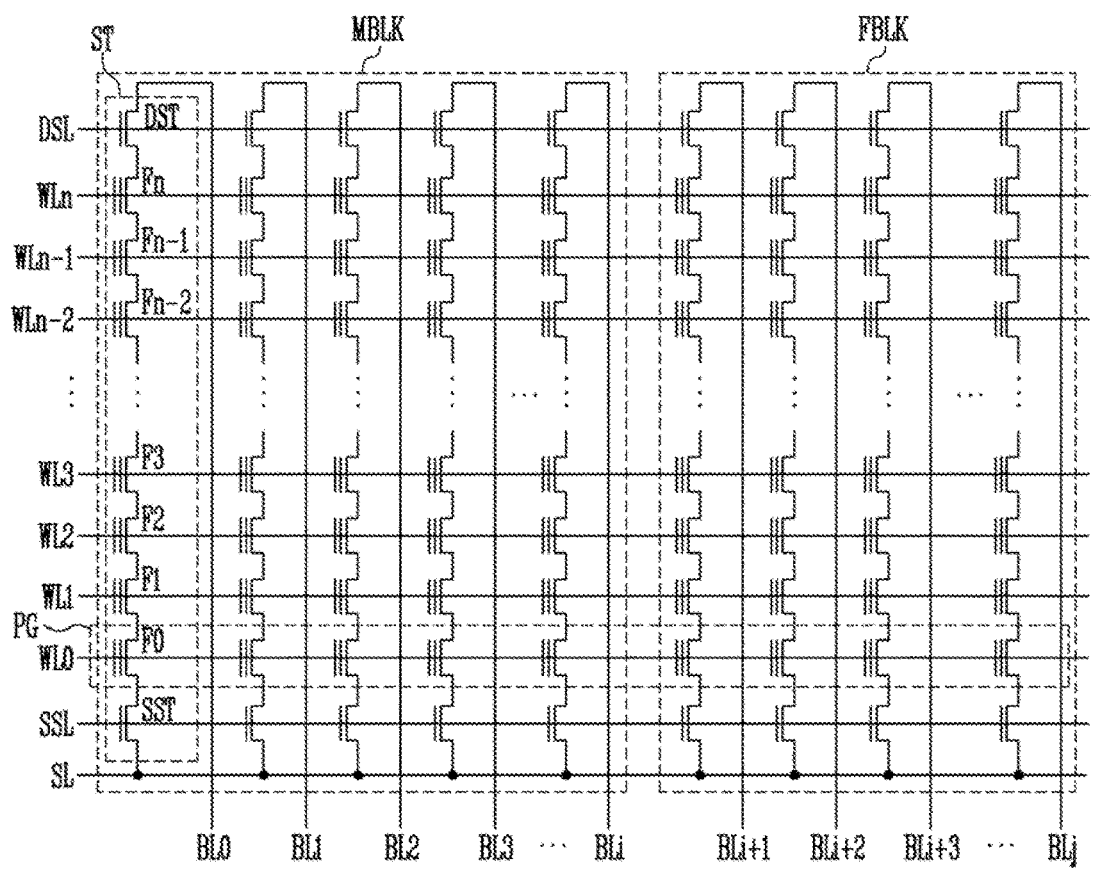
FIG. 4 is a circuit diagram illustrating a memory block of a 2-dimensional semiconductor device according to an exemplary embodiment of the present invention.

FIG. 4 is a circuit diagram illustrating a memory block of a 2-dimensional semiconductor device according to an exemplary embodiment of the present invention.

Referring to FIG. 4, one of the memory blocks of the 2-dimensional structure is illustrated as an exemplary memory block. The memory block of the 2-dimensional structure may include a main block MBLK and a flag block FBLK. The main block MBLK and the flag block FBLK of FIG. 4 may be substantially the same as shown in FIG. 3.

In the memory block of the 2-dimensional structure, the cell strings ST may be connected between the bit lines BL0 to BLj and the source line SL, and the cell strings ST may be horizontally aligned on the semiconductor substrate.

Each of the cell strings ST may include a plurality of source select transistors SST, a plurality of memory cells F0 to Fn, and a plurality of drain select transistors DST. The source select transistors SST may be connected between the source line SL and the memory cells F0. The drain select transistors DST may be connected between a plurality of bit lines BL0 to BLi and the memory cells Fn. Gates of the source select transistors SST may be connected to the source select line SSL. Gates of the memory cells F0 to Fn may be connected to the word lines WL0 to WLn. Gates of the drain select transistors DST may be connected to the drain select lines DSL. Memory cells connected to the same word line may be defined as a page PG.

The memory cells shown in FIGS. 3 and 4 have a charge trap structure. The memory cells having the charge trap structure will be explained below.

Figure 5:
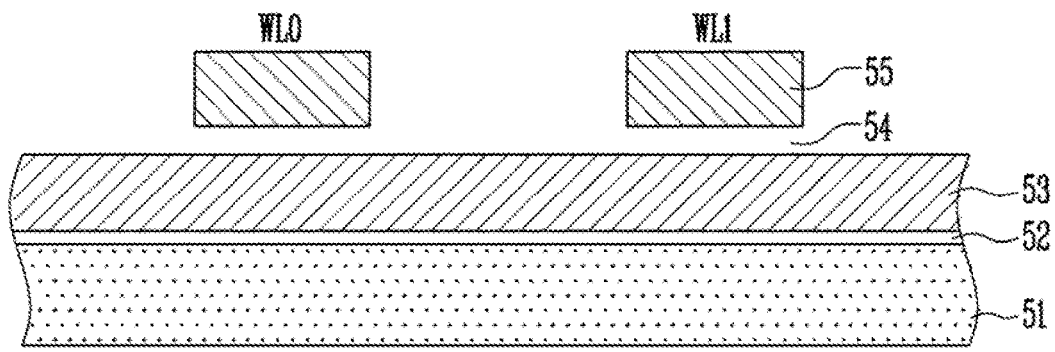
FIG. 5 is a cross-sectional view illustrating a plurality of memory cells having a charge trap structure according to an exemplary embodiment of the present invention.

FIG. 5 is a cross-sectional view illustrating a plurality of memory cells having a charge trap structure according to an exemplary embodiment of the present invention.

Referring to FIG. 5, each of the memory cells having the charge trap structure may include a channel layer 51, a gate insulating layer 52, a charge trap layer 53, a blocking layer 54, and a gate layer 55. The charge trap layer 53 may be formed between the gate insulating layer 52 and the blocking layer 54. The gate insulating layer 52 may be formed between the channel layer 51 and the charge trap layer 53. The blocking layer 54 may be formed between the charge trap layer 53 and the gate layer 55. The channel layer 51 may include a polysilicon layer. Each of the gate insulating layer 52 and the blocking layer 54 may include an oxide layer. The charge trap layer 53 may include a nitride layer. The gate layer 55 may include a conductive layer.

The memory cells of the above-mentioned memory device form the charge trap structure. When the selected memory cell performs the program operation, negative charges may be trapped in the charge trap layer 53 of the selected memory cell. However, the charge trap layer 53 may extend along the cell string, and thus the trapped negative charges in the charge trap layer 53 may dissipate toward memory cells that are adjacent to the selected memory cell. In order to prevent the dissipation of the negative charges, the following erase and program operations may be performed.

Figure 6:
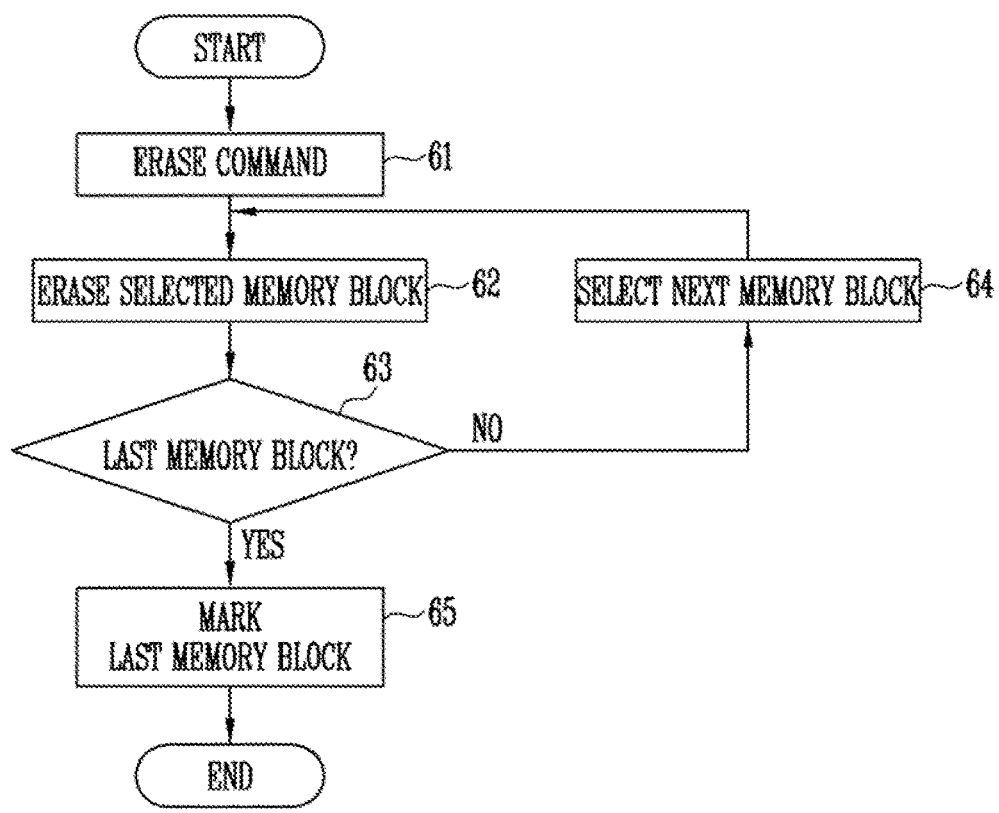
FIG. 6 is a flow chart illustrating an erase operation according to an exemplary embodiment of the present invention.
Figure 9A:
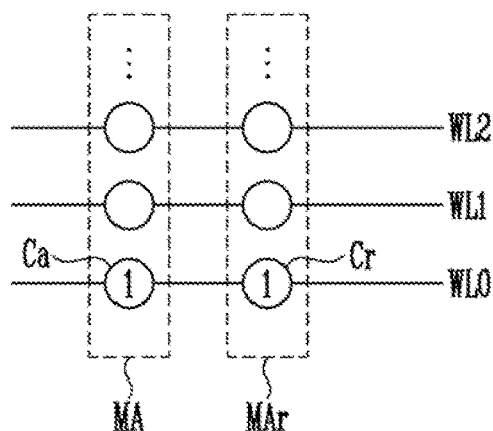
FIGS. 9A to 9C are plan views illustrating marking data according to an exemplary embodiment of the present invention.
Figure 9B:
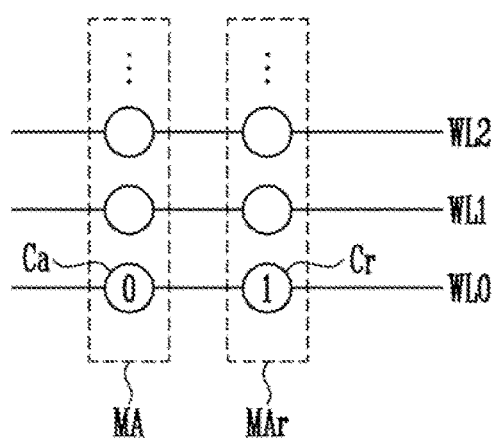
Figure 9C:
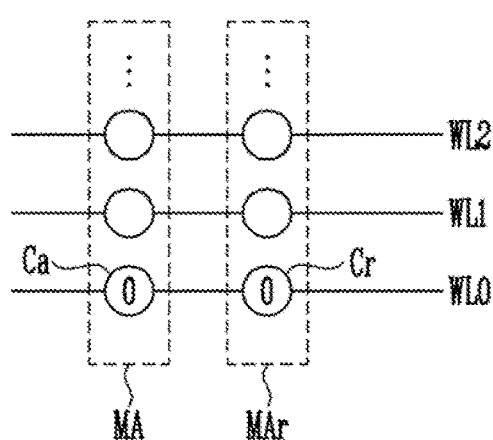

FIG. 6 is a flow chart illustrating an erase operation according to an exemplary embodiment of the present invention. FIGS. 9A to 9C are plan views illustrating marking data according to an exemplary embodiment of the present invention.

Referring to FIGS. 6, 9A, and 9B, an erase operation of one or more memory blocks may be performed to secure a programmable memory block before the program operation of the selected memory block. The above-mentioned erase operation may be performed as follows.

When an erase command signal is applied to the control circuit 130 (shown in FIG. 1) (step 61), the erase operation of the selected memory block may be performed (step 62). The erase operation may be performed on all of the cells of the selected memory block. For example, all of the normal memory cells of the main block and all of the memory cells of the flag block of the selected memory block may be erased. When the erase operation is completed, positive charges (+) may be trapped in the charge trap layer 53 (shown in FIG. 5) of the memory cells. For example, the positive charges (+) trapped in the charge trap layer 53 may be disposed in a region adjacent to the gate layer 55 (shown in FIG. 5). When the data stored in the memory cells is illustrated as '1' or '0,' '1' may represent an erase state, and '0' may represent a program state. Referring to FIG. 9A, when the erase operation is completed, marking data of flag cells Ca and Cr of the selected memory block becomes '1.'

The flag cells Ca and Cr storing the marking data may include two or more flag cells Ca and Cr among the flag cells of a same page. To clarify, 'Ca' is a first flag cell, and 'Cr' is a second flag cell. The first and second flag cells Ca and Cr may be connected to one word line WL0 of the plurality of the word lines WL0 to WL2. A cell in a first column MA may be the first flag cell Ca, and a cell in a second column MAr may be the second flag cell Cr. The semiconductor device 1000 may include flag cells connected to a plurality of word lines. In FIG. 9A, the two flag cells Ca and Cr are illustrated. The marking data stored in the first flag cell Ca may include information on whether the selected memory block including the first flag cell Ca is the lastly erased memory block. The marking data stored in the second flag cell Cr may include information on whether the selected memory block including the second flag cell Cr is programmable.

When all of the memory cells in the selected memory block are erased (step 61 shown in FIG. 6), the selected memory block may be determined to be the last memory block among the memory blocks for the erase operation (step 63).

When the selected memory block is not the last memory block ('No' of step 63), a next memory block for the erase operation may be selected (step 64). Then, the erase operation may be performed on the selected memory block (step 62). Steps 62 to 64 may be repeated until the last memory block among the memory blocks for the erase operations is erased in the erase operation. When there are many memory blocks to be erased, it may take time to perform the erase operation to all of the memory blocks, and thus positive charges (+) trapped in the memory blocks that have been erased in the previous erase operations may dissipate to adjacent memory blocks. Theoretically, the positive charges (+) trapped in the charge trap layer 53 adjacent to the memory cell should remain in their original state without dissipation. However, as time passes after the erase operation, the positive charges (+) trapped in the charge trap layer 53 may dissipate in the charge trap layer 53 that extends toward the adjacent memory cells. That is, as time passes, the positive charges (+) trapped in the charge trap layer 53 disposed in a region of the gate layer 50 may dissipate in the charge trap layer 53 toward a region in which there are no positive charges (+).

When the erased memory block is the last memory block ('Yes' in step 63), a mark operation for storing the marking data in the selected memory block may be performed (step 65). In particular, in step 63, when the number of memory blocks for the erase operation is one, the selected memory block may be set to be the last memory block. In FIG. 9B, in order to indicate that the selected memory block is the lastly erased memory block, the first flag cell Ca of the selected memory block may be programmed. When the first flag cell Ca is programmed, the marking data stored in the first flag cell Ca becomes '0.' Thus, the marking data '0' may be stored in the first flag cell Ca, and the second flag cell Cr maintains the marking data '1.' As explained above, the marking data may be stored in the flag cells of the selected memory block. The marking data may also be stored in spare cells or CAM cells instead of the flag cells. The marking data may also be stored in a ROM, a control circuit, or other storage media. When the marking data is stored in different storage media, a mapping operation may be additionally required to map the marking data to the selected memory block.

When the mark operation of the lastly erased memory block is completed (step 65 shown in FIG. 6), a following program operation may be performed.

FIG. 7 is a flow chart illustrating a program operation according to an exemplary embodiment of the present invention.

Referring to FIGS. 7, 9B, and 9C, when a program command signal is applied to the control circuit 130 (shown in FIG. 1) (step 71), one memory block may be selected by an input address (step 72).

Then, it is determined whether the selected memory block is the lastly erased memory block (step 73). In particular, the flag cells of the flag block of the selected memory block may be read, and it is determined whether the selected memory block is the lastly erased memory block based on the read data. In the above-mentioned determination operation, the first flag cell Ca (shown in FIG. 9B) of the selected memory block may be read, and the determination operation may be performed based on the read marking data. For example, when the marking data stored in the first flag cell Ca is '0,' the selected memory block may be determined to be the lastly erased memory block at step 73. When the marking data is '1,' the selected memory block may be determined not to be the lastly erased memory block at step 73.

When the selected memory block is determined to be the lastly erased memory block at step 73, it is determined whether only the selected memory block is the programmable memory block (step 74). In the above-mentioned determination operation, the first and second flag cells Ca and Cr (shown in FIG. 9B) of the selected memory block may be read, and the determination operation may be performed based on the read marking data. For example, when the marking data stored in the first and second flag cells Ca and Cr is different, only the selected memory block may be determined to be the programmable memory block at step 74. When the marking data is substantially the same, memory blocks other than the selected memory block may be determined to be the programmable memory block at step 74.

When it is determined that only the selected memory block is programmable at step 74, the selected memory block may be the lastly erased memory block, and thus the selected memory block may be not immediately programmed. Instead of immediately programming the selected memory block, the hidden memory block may be selected (step 76), and a program operation for the selected hidden memory block may be performed (step 77). The reason for selecting the hidden memory block instead of the selected memory block may be as follows. When the selected memory block is the lastly erased memory block, the positive charges (+) of the erased memory cells may not dissipate. Thus, in order to secure the time for the positive charges (+) of the erased memory cells of the selected memory block to dissipate, the hidden memory block may be selected instead of the selected memory block (step 76), and the program operation of the selected hidden memory block may be performed (step 77). The program operation of the hidden memory block may be substantially the same as the program operation of the lastly erased memory block.

When memory blocks other than the selected memory block are determined to be the programmable memory block at step 74, a next memory block may be selected (step 75). That is, when there are erased memory blocks other than the selected memory block or the lastly erased memory block, one memory block among the erased memory blocks may be selected (step 75). Since the selected memory block that is selected in step 75 is not the lastly erased memory block, it may be determined that the memory block selected in step 75 is not the lastly erased memory block at step 73, which is feed backed from step 75, and the program operation of the selected memory block may be performed (step 77).

In step 77, when the program operation of the selected memory block is performed, the negative charges (−) may be trapped in the charge trap layer of the selected memory cells of the selected memory block. Most of the negative charges (−) may be trapped between diffused positive charges (+), and thus the diffusion of the negative charges (−) trapped in the charge trap layer 53 in the selected memory cell region may be decreased even when the program operation of the memory cells is completed. That is, before the negative charges (−) are trapped in the charge trap layer 53, the positive charges (+) may be diffused so that the diffusion of the negative charges (−) may be prevented by the diffusion of the positive charges (+).

In the above-mentioned program method, when the number of the erased memory blocks is one, the program operation for the selected memory block may be performed on the hidden memory block. The hidden memory block may be the block on which the program operation is temporarily performed. Thus, after the program operation of the hidden memory block is completed, the following operation may be performed.

FIG. 8 is a flow chart illustrating a hidden memory block operation after a program operation according to an exemplary embodiment of the present invention.

Referring to FIG. 8, after the program operation of the hidden memory block is completed (step 77 of FIG. 7 or step 81 of FIG. 8), a copy back operation may be performed on the lastly erased memory block (step 82). That is, the data stored in the hidden memory block may be copied to the lastly erased memory block. When the copy back operation is completed (step 83), the hidden memory block may be erased (step 83).

After the hidden memory block is erased, the second flag cell Cr (shown in FIG. 10C) of the memory block, in which the data is stored by the copy back operation, may be programmed, and thus an operation for changing the marking data in the second flag cell Cr from data value of '1' into data value of '0' may be additionally performed. The above-mentioned operation for changing the value of the marking data may prevent repetitive program operations through repetitive selection of the selected memory block in a subsequent program operation. That is, when the marking data having a value of '0' representing the lastly erased memory block is stored in the first flag cell Ca of the selected memory block, the marking data of '0' may be stored in the second flag cell Cr in order to prevent repetitive program operations through repetitive selection of the selected memory block during the subsequent program operation. When the marking data of '0' is stored in the second flag cell Cr, the first and second flag cells Ca and Cr of the corresponding memory block store the marking data of '0.' Thus, in step 74, the corresponding memory block may not be determined as the programmable memory block.

As described above, because the program operation may be performed after the positive charges trapped in the charge trap layer of the erased memory cells are dissipated, retention characteristics of the programmed memory cells may be improved. Thus, reliability of the semiconductor device may be improved.

Figure 10:
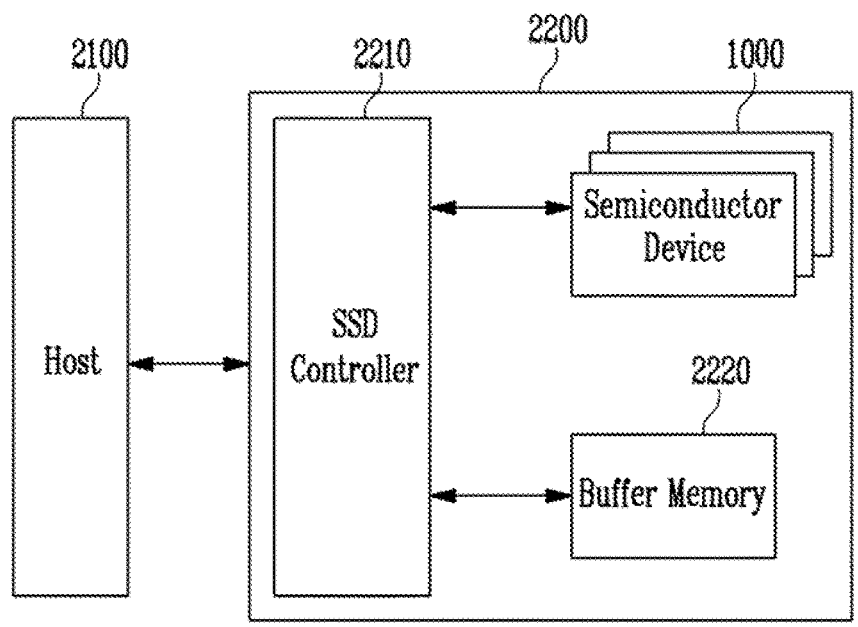
FIG. 10 is a block diagram illustrating a solid state drive including a semiconductor device according to an exemplary embodiment of the present invention.

FIG. 10 is a block diagram illustrating a solid state drive including a semiconductor device according to an exemplary embodiment of the present invention.

Referring to FIG. 10, the drive device 2000 may include a host 2100 and a solid state drive (SSD) 2200. The SSD 2200 may include an SSD controller 2210, a buffer memory 2220, and a semiconductor device 1000.

The SSD controller 2210 physically connects the host 2100 to the SSD 2200. That is, the SSD controller 2210 provides an interface with the SSD 2200 corresponding to a bus format of the host 2100. In particular, the SSD controller 2210 decodes commands provided from the host 2100. As a result of the decoding, the SSD controller 2210 accesses the semiconductor device 1000. The bus format of the host 2100 may include a Universal Serial Bus (USB), Small Computer System Interface (SCSI), PCI Express, ATA, Parallel ATA (PATA), Serial ATA (SATA), Serial Attached SCSI (SAS), etc.

Program data provided from the host 2100 or data read from the semiconductor device 1000 may be temporarily stored in the buffer memory 2220. When the host 2100 requests the reading operation and data in the semiconductor device 1000 is cached, the buffer memory 2220 may perform a caching operation in which the cache data is directly supplied to the host 2100. In general, the data transfer speed of the bus format (for example, SATA or SAS) of the host 2100 is faster than the transmission speed of the memory channel of the SSD 2200. That is, although the interface speed of the host 2100 is faster than the transmission speed of the memory channel of the SSD 2200, a difference between the transmission speed of the buffer memory 2220 of the high capacity and the interface speed of the host 2100 may be minimized, thereby preventing degradation of the performance. The buffer memory 2220 may include a synchronous DRAM having enough buffer capacity in the SSD 2200.

The semiconductor device 1000 may be used as a storing device of the SSD 2200. For example, the semiconductor device 1000 may be used as a nonvolatile memory device of high capacity as explained with reference to FIG. 1. In particular, the semiconductor device 1000 may be used as a NAND-type flash memory.

Figure 11:
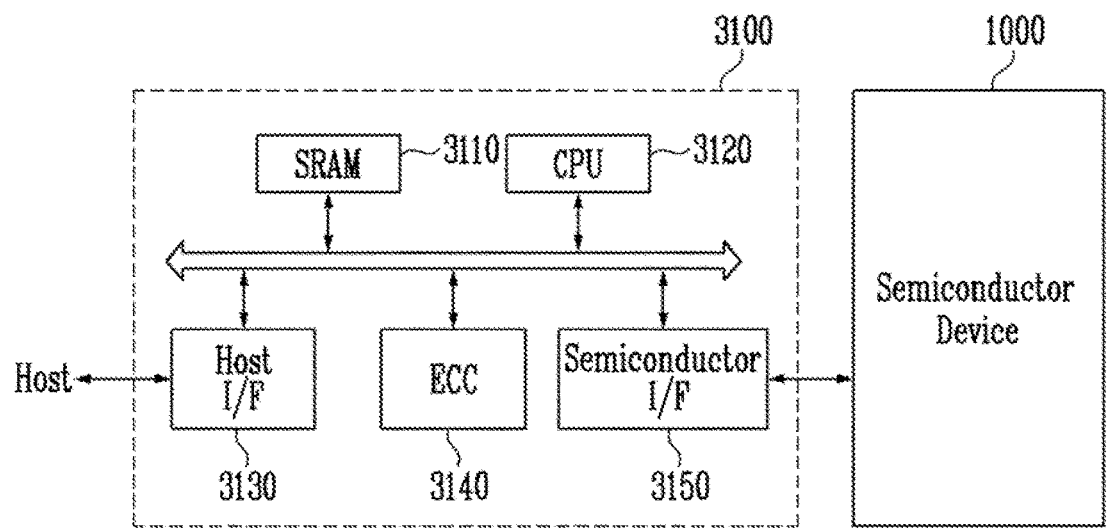
FIG. 11 is a block diagram illustrating a memory system including a semiconductor device according to an exemplary embodiment of the present invention.

FIG. 11 is a block diagram illustrating a memory system including a semiconductor device according to an exemplary embodiment of the present invention.

Referring to FIG. 11, the memory system 3000 may include a memory controller 3100 and a semiconductor device 1000.

The semiconductor device 1000 may be substantially the same as shown in FIG. 1. Thus, any repetitive explanations concerning the same elements will be omitted.

The memory controller 3100 may have a structure configured to control the semiconductor device 1000. An SRAM 3110 may be used as a working memory. A host interface (I/F) 3130 may include a data exchange protocol of the host connected to the memory system 3000. An error correct circuit (ECC) 3140 in the memory controller 3100 may detect or correct an error in the data read from the semiconductor device 1000. A semiconductor interface (I/F) 3150 may interface with the semiconductor device 1000. A CPU 3120 may control data exchange of the memory controller 3100. Also, although not shown in FIG. 9, the memory system 3000 may further include a ROM configured to store code data for interfacing with the host.

The memory system 3000 of the present invention may be applied to a computer, an ultra mobile PC (UMPC), a workstation, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device configured to wirelessly transmit and receive information, one of various devices configured to compose a home network, etc.

Figure 12:
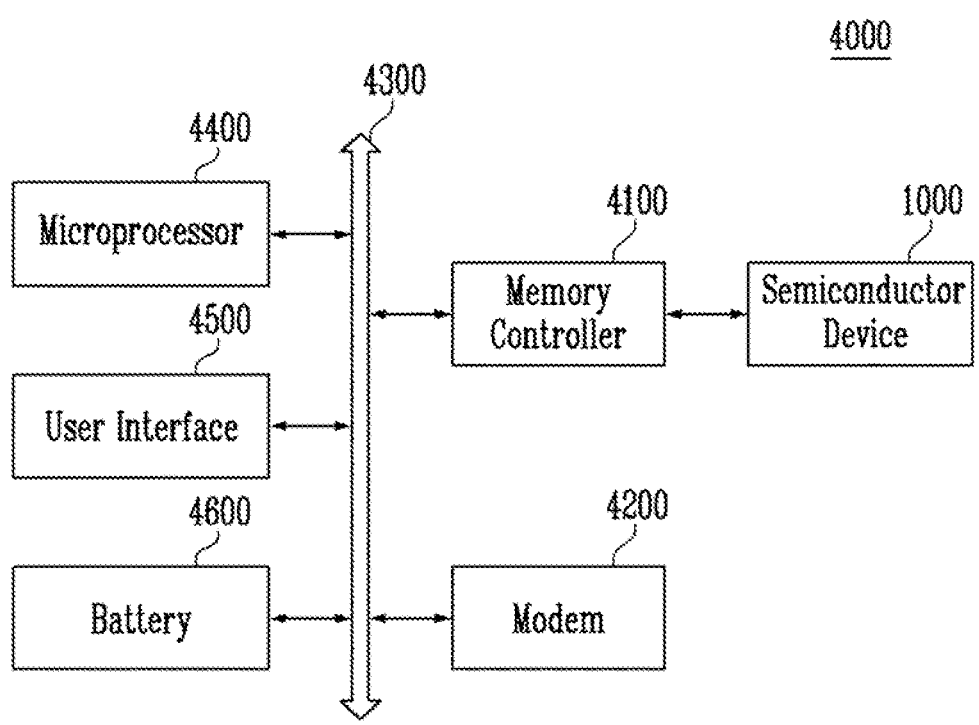
FIG. 12 is a block diagram illustrating a computing system including a semiconductor device according to an exemplary embodiment of the present invention.

FIG. 12 is a block diagram illustrating a computing system including a semiconductor device according to an exemplary embodiment of the present invention.

Referring to FIG. 12, the computing system 4000 may include a semiconductor device 1000 electrically connected to a bus 4300, a memory controller 4100, a modem 4200, a microprocessor 4400, and a user interface 4500. When the computing system 4000 is a mobile device, the computing system 4000 may further include a battery 4600. Though not shown in FIG. 10, the computing system 4000 may further include an application chip set, a camera image processor (CIS), a mobile DRAM, etc.

The semiconductor device 1000 may have substantially the same structure as shown in FIG. 1. Thus, any repetitive explanation concerning the semiconductor device 1000 will be omitted.

The memory controller 4100 and the semiconductor device 1000 may compose a solid state drive/disk (SSD).

The semiconductor device and the memory controller of the present invention may be mounted using various packages. For example, the semiconductor device and the memory controller of the present invention may be mounted using packages such as a package on package (PoP), ball grid arrays (BGAs), chip scale packages (CSPs), a plastic leaded chip carrier (PLCC), a plastic dual in-line package (PDIP), a die in wafer pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

According to the present invention, a sensing layer may be divided into rectangular blocks by an electrode and a layer pattern to remove current that non-uniformly flows into the electrode, and thus current of the sensing layer may uniformly flow and noise may be reduced. Further, a resistance value of the sensing layer can be lowered, so that Johnson noise is efficiently reduced. Moreover, compared with the conventional sensor structure, no additional processes are required, and thus fabrication can be accomplished with simple processes.

In the drawings and specification, there have been disclosed typical exemplary embodiments of the invention, and although specific terms are employed, they are used in a generic and descriptive sense only and not for the purpose of limitation. As for the scope of the invention, it is to be set forth in the following claims. Therefore, it will be understood by those of ordinary skill in the art that various changes in form and detail may be made without departing from the spirit and scope of the present invention as defined by the following claims.

What is claimed is:

1. A method of operating a semiconductor device, comprising:
   erasing memory blocks of a cell array of the semiconductor device;
   determining whether a selected memory block among the erased memory blocks is a lastly erased memory block; and
   programming the selected memory block or another memory block according to a result of determination, wherein the erasing of the memory blocks of the cell array of the semiconductor device comprises:
sequentially erasing the memory blocks; and
marking the lastly erased memory block, and
wherein the marking of the lastly erased memory block programs marking data on a flag cell of the lastly erased memory block.

2. The method of claim 1, wherein it is determined whether the selected memory block among the erased memory blocks is the lastly erased memory block based on the marking data.

3. The method of claim 2, wherein the marking data has a value of '0' indicating the lastly erased memory block, or a value of '1' indicating a memory block other than the lastly erased memory block.

4. The method of claim 1,
wherein the memory blocks include one or more hidden memory blocks, and
wherein the erasing erases two or more memory blocks including the hidden memory blocks.

5. The method of claim 4, wherein the erased memory block is determined to be the lastly erased memory block when the number of the erased memory blocks other than the hidden memory block is one.

6. The method of claim 5, wherein the program operation is performed on the hidden memory block when the lastly erased memory block is the only remaining programmable memory block.

7. The method of claim 6, further comprising, after the program operation of the hidden memory block is completed, copying the programmed data of the hidden memory blocks back into the lastly erased memory block.

8. The method of claim 7, further comprising, after the copying of the data back into the erased memory block, marking the lastly erased memory block as a programmed memory block after the copying.

9. The method of claim 8, wherein the marking of the lastly erased memory block programs marking data on a flag cell of the lastly erased memory block.

10. The method of claim 9, wherein the lastly erased memory block having the marking data is free from a subsequent program operation.

11. A semiconductor device comprising:
a cell array including memory blocks, one or more of which are hidden memory blocks;
a peripheral circuit suitable for performing an erase operation and a program operation on the memory blocks; and
a control circuit suitable for controlling the peripheral circuit to erase memory blocks, and determine whether a selected memory block among the memory blocks is a lastly erased memory block, and program the selected memory block or another memory block according to a result of determination,
wherein the control circuit controls the peripheral circuit to mark the lastly erased memory block among the memory blocks, and
wherein the control circuit controls the peripheral circuit to program marking data on a flag cell of the lastly erased memory block.

12. The semiconductor device of claim 11, wherein each of the memory blocks comprises memory cells having a charge trap layer structure.

13. The semiconductor device of claim 11, wherein the control circuit identifies the lastly erased memory block based on the marking data.

14. The semiconductor device of claim 11,
wherein the control circuit identifies the lastly erased memory block from the selected memory blocks other than the hidden memory blocks, and
wherein the control circuit controls the peripheral circuit to perform the program operation on the hidden memory blocks when the lastly erased memory block is the only remaining programmable memory block.

15. The semiconductor device of claim 14, wherein the control circuit controls the peripheral circuit to copy the programmed data of the hidden memory blocks into the lastly erased memory block.

16. The semiconductor device of claim 15, wherein the control circuit controls the peripheral circuit to mark the lastly erased memory block as a programmed memory block after the copying.

17. The semiconductor device of claim 16, wherein the control circuit controls the peripheral circuit to program a marking data on a flag cell of the lastly erased memory block.

* * * * *